United States Patent
Castagna et al.

(10) Patent No.: US 8,981,400 B2
(45) Date of Patent: Mar. 17, 2015

(54) RESONANT CAVITY OPTICAL RADIATION EMISSION DEVICE AND PROCESS FOR MANUFACTURING SAME

(75) Inventors: Maria Eloisa Castagna, Agrate Brianza (IT); Anna Muscara', Agrate Brianza (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 963 days.

(21) Appl. No.: 12/578,313

(22) Filed: Oct. 13, 2009

(65) Prior Publication Data

US 2010/0102346 A1   Apr. 29, 2010

(30) Foreign Application Priority Data

Oct. 23, 2008   (IT) .............................. TO2008A0781

(51) Int. Cl.
| | |
|---|---|
| *H01L 33/00* | (2010.01) |
| *H01L 33/10* | (2010.01) |
| *H01L 33/34* | (2010.01) |
| H01L 33/46 | (2010.01) |
| H01S 3/16 | (2006.01) |
| H01S 5/026 | (2006.01) |
| H01S 5/183 | (2006.01) |
| H01S 5/32 | (2006.01) |

(52) U.S. Cl.
CPC .......... *H01L 33/0041* (2013.01); *H01L 33/105* (2013.01); *H01L 33/34* (2013.01); *H01L 33/343* (2013.01); *H01L 33/465* (2013.01); *H01S 3/1608* (2013.01); *H01S 5/0261* (2013.01); *H01S 5/18308* (2013.01); *H01S 5/18341* (2013.01); *H01S 5/18369* (2013.01); *H01S 5/3211* (2013.01); *H01S 5/3224* (2013.01)
USPC ......................... 257/98; 438/29; 257/E33.067

(58) Field of Classification Search
CPC .... H01L 33/0041; H01L 33/105; H01L 33/34
USPC ................................................ 257/79, 98, 292
See application file for complete search history.

(56) References Cited

U.S. PATENT DOCUMENTS

| | | | |
|---|---|---|---|
| 3,492,548 A | | 1/1970 | Goodman |
| 5,726,462 A | * | 3/1998 | Spahn et al. .................... 257/76 |

(Continued)

FOREIGN PATENT DOCUMENTS

EP   1734591 A1   12/2006

OTHER PUBLICATIONS

M. E. Castagna, et al., "High Efficiency Light Emitting Devices in Silicon," Materials Science and Engineering, Elsevier B.V., 2003, pp. 83-90.

Italian Patent Office Written Opinion; Italy Application No. TO20080781, Aug. 13, 2009, 7 pages.

(Continued)

*Primary Examiner* — Laura Menz
*Assistant Examiner* — Candice Y Chan
(74) *Attorney, Agent, or Firm* — Allen, Dyer, Doppelt, Milbrath & Gilchrist, P.A.

(57) ABSTRACT

A device having an FET structure for the emission of an optical radiation integrated on a substrate of a semiconductor material, includes a first mirror, a second mirror of a dielectric type and an active layer comprising a main zone designed to be excited to generate the radiation. The device also includes a first electrically conductive layer containing two doped regions constitutes a source well and a drain well between which a current flows, a second electrically conductive layer which constitutes a gate, and a dielectric region between the first and second layer, to space corresponding peripheral portions of the first and second layers so that the current is channeled in the main zone for generating excitation radiation. The first and second electrically conductive layers and the active layer define an optical cavity.

20 Claims, 4 Drawing Sheets

(56) References Cited

U.S. PATENT DOCUMENTS

| | | |
|---|---|---|
| 6,340,826 B1 | 1/2002 | Iliadis |
| 2006/0043380 A1 | 3/2006 | Hiroshi et al. |
| 2006/0284200 A1 | 12/2006 | Coffa et al. |
| 2007/0187665 A1 | 8/2007 | Tada et al. |

OTHER PUBLICATIONS

Robert J. Walters, et al., "Silicon Nanocrystal Field-Effect Light-Emitting Devices", IEEE Journal of Selected Topics in Quantum Electronics; vol. 12. No. 6; Nov. 1, 2006; pp. 1647-1656.

* cited by examiner

RESONANT CAVITY OPTICAL RADIATION EMISSION DEVICE AND PROCESS FOR MANUFACTURING SAME

RELATED APPLICATION

The present application claims priority of Italian Patent Application No. TO2008A000781 filed Oct. 23, 2008, which is incorporated herein in its entirety by this reference.

FIELD OF THE INVENTION

The present invention relates to a resonant cavity device for the emission of optical radiation and more specifically, to a resonant cavity device with an FET (field-effect transistor) structure.

BACKGROUND

In recent years much effort has been aimed at the development of resonant cavity light emitting devices used as light sources, in the field of optical transmissions within a communications network. One such device is a Resonant Cavity Light Emitting Diode (RCLED). European Patent Application Publication No. EP 1 734 591 describes an RCLED having an electro-luminescent active layer placed between two mirrors made with a succession of layers of silicon dioxide and of silicon. The active layer constitutes the resonant cavity. The last layer of the lower mirror and the first layer of the upper mirror are made from doped silicon so as to constitute two electrically conductive layers. Such layers operatively constitute two armatures used to supply a pumping electrical signal to the cavity between which the electric field necessary for the generation of the radiation is established. Such electrically conductive layers are entirely included within the mirrors, lower and upper respectively.

It should be observed that the materials for making the mirrors are restricted by the fact that the last layer of the lower mirror and the first layer of the upper mirror must be made from silicon in order to be able to constitute the two armatures.

It should also be noted that the threshold voltage and the working voltage of such a device are quite high, typically around values of 25-30 V (threshold voltage) and 150-200 V (working voltage).

SUMMARY OF THE INVENTION

The purpose of the present invention is therefore to propose a resonant cavity device for the emission of optical radiation of active layer electrically pumping type, with an alternative structure to the known ones, in which the mirrors can also be made from different materials to the ones currently used.

This and other purposes are achieved with a device having an FET structure for the emission of an optical radiation integrated on a substrate of a semiconductor material, includes a first mirror, a second mirror of a dielectric type and an active layer comprising a main zone designed to be excited to generate the radiation. The device also includes a first electrically conductive layer containing two doped regions constitutes a source well and a drain well between which a current flows, a second electrically conductive layer which constitutes a gate, and a dielectric region between the first and second layer, to space corresponding peripheral portions of the first and second layers so that the current is channelled in the main zone for generating excitation radiation. The first and second electrically conductive layers and the active layer define an optical cavity.

A further object of the invention is a process for manufacturing a device for the emission of optical radiation as disclosed.

BRIEF DESCRIPTION OF THE DRAWINGS

Further characteristics and advantages of the invention shall become clear from the following detailed description, given purely as a non-limiting example, with reference to the attached drawings, in which.

DETAILED DESCRIPTION OF PREFERRED EMBODIMENTS

With reference to FIGS. 1 to 7 a process for manufacturing an RCLED device with an emission wavelength $\lambda_0$ shall now be described in which the active layer that can be used is, preferably, of the SRO (Silicon Rich Oxide) type, i.e. silicon dioxide ($SiO_2$) enriched with silicon (Si), doped with erbium.

Figure 1:
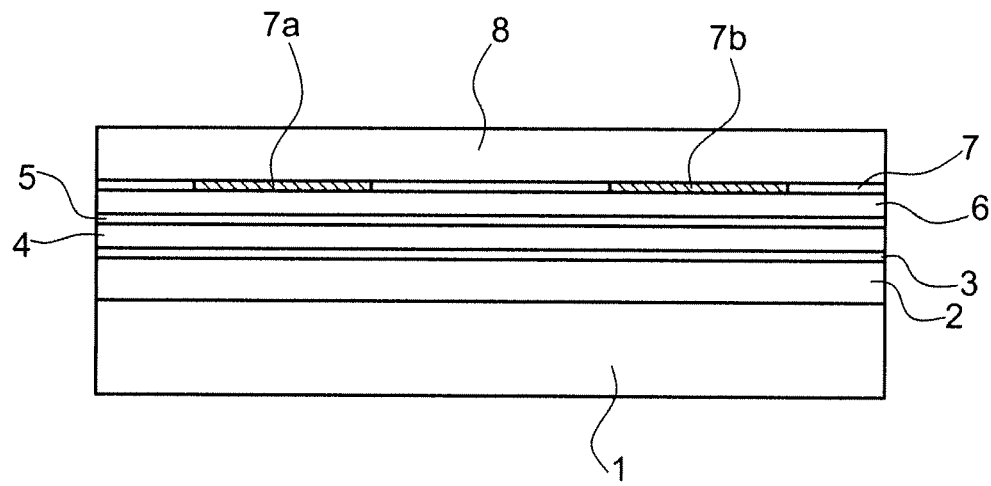
FIGS. 1 to 7 are longitudinal section views of intermediate steps of a process for manufacturing a device according to an embodiment of the present invention.

As shown in FIG. 1, a first layer of silicon dioxide 2 with thickness $d_2$ and refractive index $n_2$ is deposited on a support substrate 1. Alternatively, in the case in which the support substrate is silicon, the silicon dioxide can be made by thermal growth. A first layer of silicon nitride 3 that has a refractive index $n_3$ and thickness $d_3$ is deposited on the first dioxide layer 2. A second layer of silicon dioxide 4 of thickness $d_4$ and refractive index $n_4$ is then deposited on the first layer of silicon nitride 3. A second layer of silicon nitride 5 having refractive index $n_5$ and thickness $d_5$ is deposited on the second layer of silicon dioxide 4. A third layer of silicon dioxide 6 having refractive index $n_6$ and thickness $d_6$ is deposited on the second layer of silicon nitride 5.

Such a sequence can be repeated many times thus increasing the reflectivity of the lower mirror, consisting of a variable number of silicon nitride/silicon dioxide pairs of suitable thickness and refractive index such that the product of the thickness by the refractive index of each layer is equal to $\lambda_0/4$, so as to satisfy the condition of constructive interference for all of the layers constituting the mirror.

As an alternative to the silicon nitride and silicon dioxide pair it is possible to use other pairs of materials having different refractive index and morphological and reticular characteristics such as to be able to be coupled so as to make a dielectric mirror.

A first layer of doped poly-silicon 7 (preferably with P+ type doping) is deposited on the third layer of silicon dioxide 6. The doping can be obtained by doping the layer of amorphous silicon during the deposition phase or else in a subsequent application phase. This material has refractive index $n_7$ and is deposited until a thickness $d_7$ is reached.

Thereafter, two N+ doped wells 7a and 7b (source and drain) are formed in the first layer of P+ doped poly-silicon 7. Such a first layer of P+ doped poly-silicon 7 forms the lower confinement layer of the optical cavity whose formation process shall be described hereafter.

A layer of dielectric material 8, such as passivation silicon oxide, i.e. having an electrical insulation function between portions of the device, is deposited on the first doped poly-silicon layer 7.

Such a passivation layer 8 (having, for example, a thickness of 10.000 Å) when obtained through vapor phase deposition is known to the man skilled in the art, in other applications, by the name VAPDX. A layer of VAPDX deposited with vapor phase has a large amount of hydrogen inside it that is, advantageously, expelled through densification, i.e. a heat treatment at about 1100° C. for a duration of about 60 minutes.

Figure 2:
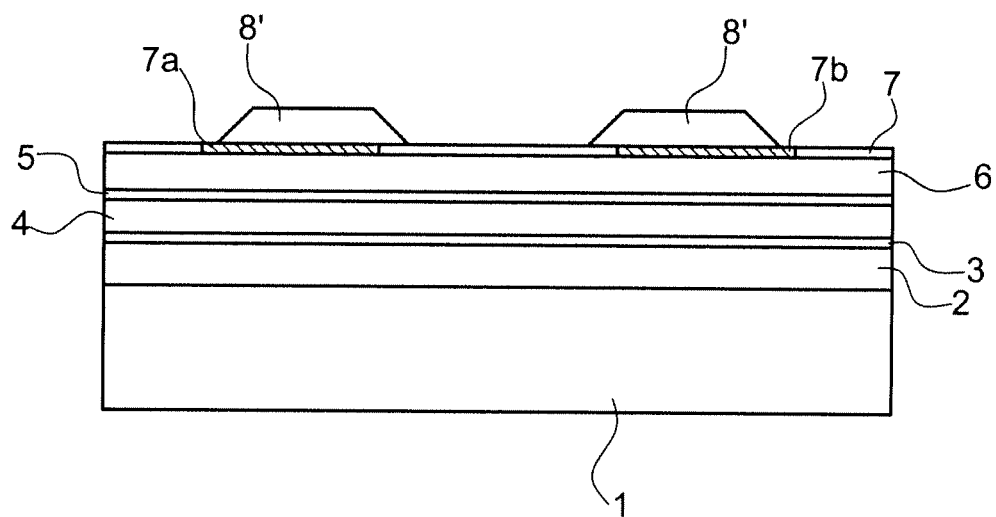

Thereafter a typical photolithographic process is carried out (which comprises a first step of defining a photo-mask and a second wet etching step) to obtain from the layer of dielectric VAPDX 8 a dielectric region 8', as shown in the example of FIG. 2, with substantially trapezoidal section, due to the use of a wet etching, and therefore isotropic, that allows the inclined walls to be etched.

Figure 3:
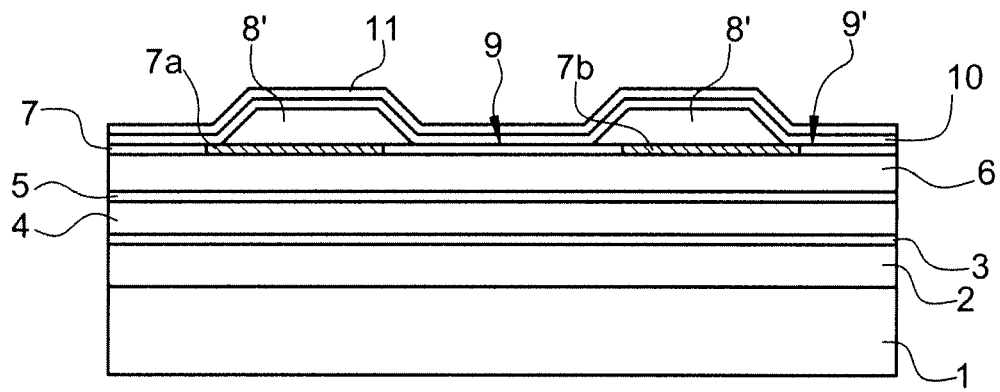

Thereafter, as shown in FIG. 3, a deposition phase of an active layer 10 that morphologically follows the profile of the structure illustrated in FIG. 2 is carried out. In greater detail, the active layer 10 is positioned in contact with the first electrically conductive layer 7, in a side region 9' and in a first region 9, substantially defined inside the dielectric region 8', and in contact with said dielectric region 8'.

The active layer 10 has refractive index $n_{10}$ and is deposited until a thickness $d_{10}$ is reached. The thickness of the layer must be such as not to interfere with the propagation of the electromagnetic wave within the cavity. The active layer that can be used, in addition to the aforementioned SRO, can be SRO doped with rare earths like, for example, terbium (Tb), ytterbium (Yb) or erbium (Eb). The possibility of using these rare earths as active layers is described in the article "High efficiency light emitting device in silicon", by M. E. Castagna, S. Coffa, M. Monaco, A. Muscarà, L. Caristia, S. Lorenti, A. Messina; Material Science and Engineering, B105(2003) pages 83-90.

Thereafter comes the deposition, above the active layer 10, of a second electrically conductive layer 11 made, for example, with N+ doped poly-silicon. This material has refractive index $n_{11}$ and is deposited until a thickness $d_{11}$ is reached.

Such a second layer of N+ doped poly-silicon 11 constitutes the upper confinement layer of the optical cavity and represents the gate of the FET structure that is thus formed and that has the active layer 10 as gate dielectric.

The optical cavity is thus formed by the layers of doped poly-silicon 7 and 11 (which constitute the spacers) and by the active layer 10. The sum of the products of the thicknesses of the layers of the optical cavity by the respective refraction indices must be equal to a whole multiple of $\lambda_0/2$, so as to satisfy the destructive interference condition for all of the layers constituting such a cavity.

The first layer of poly-silicon 7 can also be doped only of N or P type. In this case, the device is not polarised like a FET device, but maintains the condenser operation as described in document EP 1 734 591 cited above, with the substantial difference that in this case the optical cavity consists, as stated above, of the two layers of poly-silicon 7 and 11 and of the active layer 10, whereas in document EP 1 734 591 the optical cavity did not comprise the layers of poly-silicon.

Figure 4:
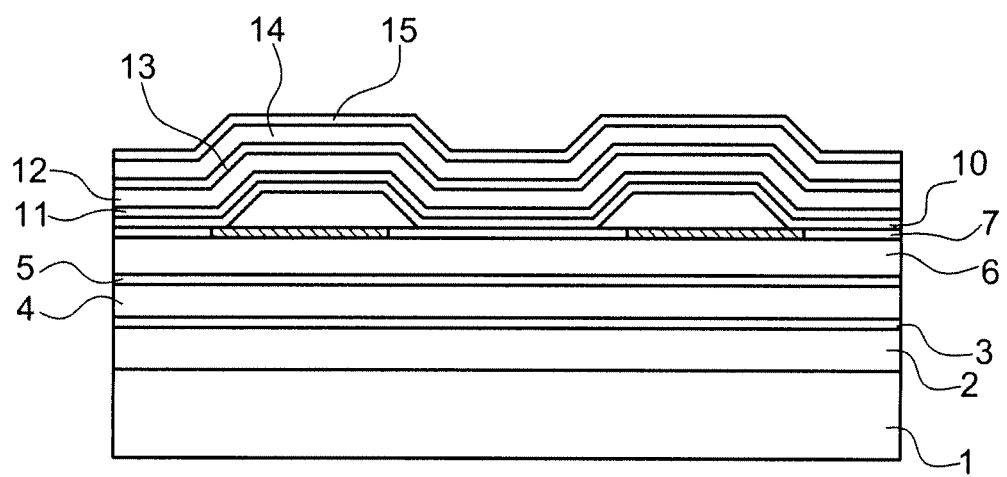

With reference to FIG. 4, a fourth layer of silicon dioxide 12, having refractive index $n_{12}$ and thickness $d_{12}$ is deposited on the second layer of doped poly-silicon 11. A third layer of non-doped silicon nitride 13 that has refractive index $n_{13}$ and thickness $d_{13}$ is deposited on this fourth layer of silicon dioxide 12. A fifth layer of silicon dioxide 14 having refractive index $n_{14}$ and thickness $d_{14}$ is deposited on the third layer of non-doped silicon nitride 13. A fourth layer of silicon nitride 15 having refractive index $n_{15}$ and thickness $d_{15}$ is deposited on the fifth layer of silicon dioxide 14.

Also in this case the succession of depositions can be repeated, obtaining a mirror of suitable reflectivity, relative to the applications of interest, having the same interference properties described above in reference to the lower mirror but with lower overall reflectivity. Nevertheless, it is important for the succession of depositions to conclude with the deposition of a layer of silicon nitride of suitable thickness and refractive index. As shall be described later on, it is foreseen to deposit a layer of passivation oxide on the latter.

Figure 5:
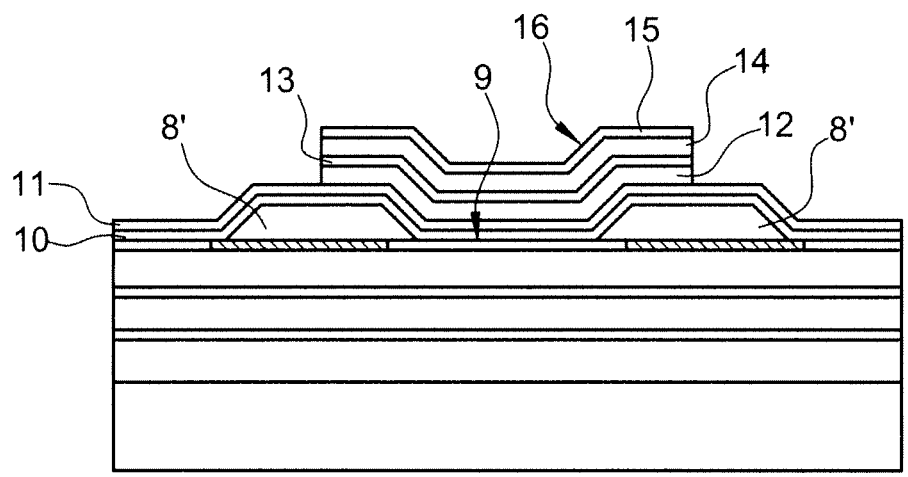

This is followed by a typical photolithographic process that comprises a first step of defining the photo-mask and a second dry etching step to remove side portions of the layers 12, 13, 14 and 15 leaving unchanged a first multi-layer structure 16 formed from the pile of said layers substantially aligned with the first region 9 and with part of the dielectric region 8' (FIG. 5). The use of dry etching of the anisotropic type allows the multi-layer structure to be defined with substantially vertical side walls.

Figure 6:
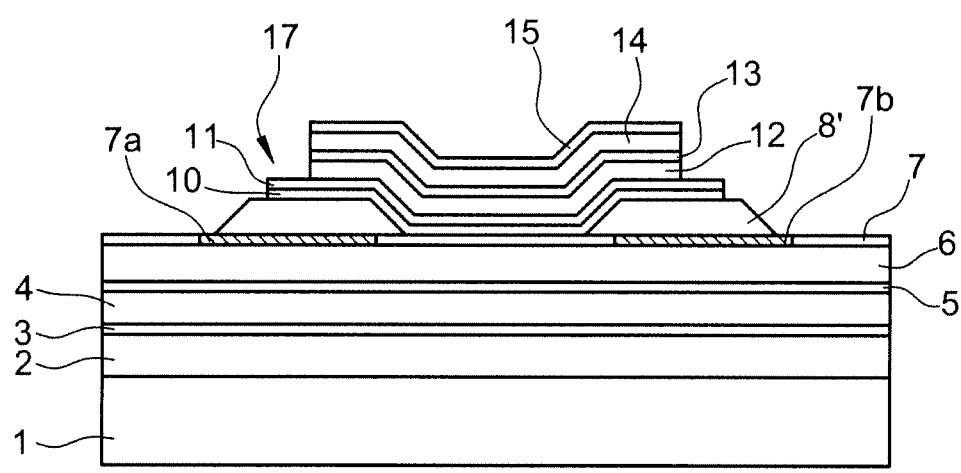

Similarly, there is a photolithographic process in which a photo-mask is defined and dry etching is carried out so as to remove further side portions of the layers 10 and 11 to obtain a second multi-layer structure 17 formed from the pile of said layers aligned with almost the entire part of the dielectric region 8' and extending farther with respect to the first multi-layer structure 16, as illustrated in FIG. 6.

Figure 7:
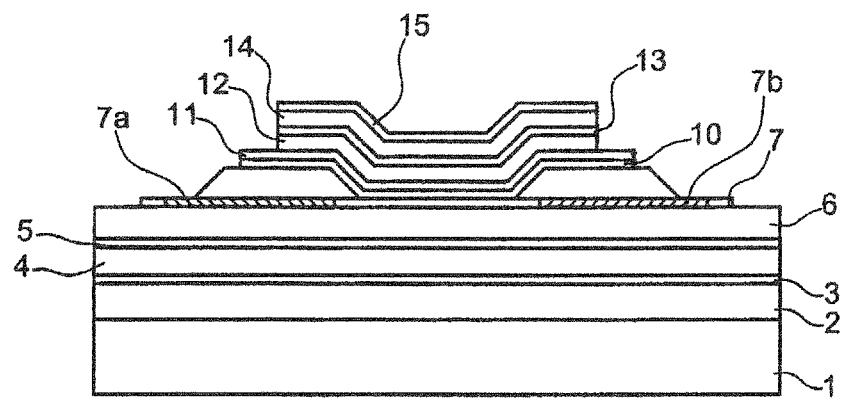

A subsequent photolithographic process comprises the definition of a photomask the profile of which exposes the first layer of P+ doped poly-silicon 7 to a dry etching step after which peripheral portions of said first layer 7 are removed, obtaining the shape represented in FIG. 7 that leaves a peripheral portion of the layer 6 uncovered.

Figure 8:
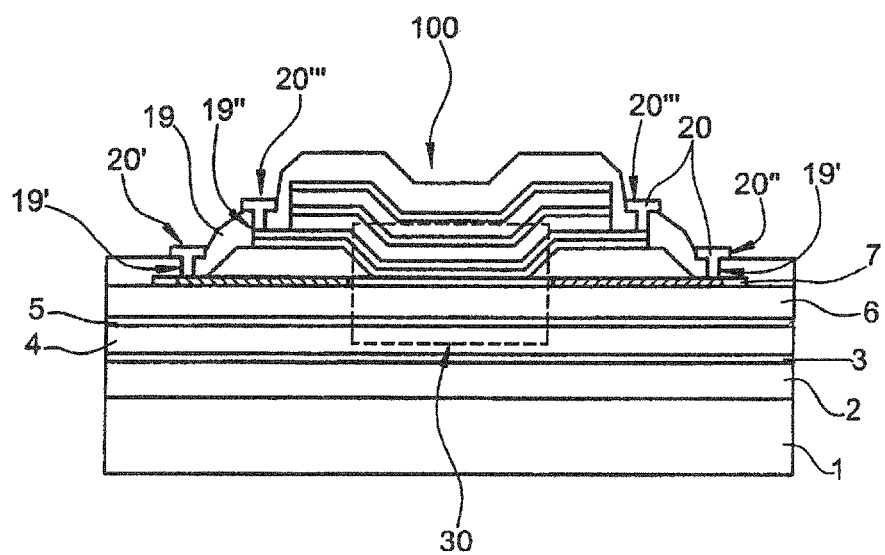
FIG. 8 is a longitudinal section view of a device according to an embodiment of the present invention.

With reference to FIG. 8, a fifth layer of oxide 19 having refractive index $n_{19}$ and thickness $d_{19}$ is deposited on the structure of FIG. 7. Such a layer has the function of a passivation layer and is part of the upper mirror. This is followed by an annealing step at a temperature of between 750° C. and 1100° C. or, alternatively, a rapid thermal annealing (RTA) step to activate the doping of the poly-silicon at a temperature of about 1000° C. for a period of about 60 seconds. The choice of which of the two annealing treatments to use depends upon the active layer that is intended to be activated. For example, in the case of SRO doped erbium there is heating to 800° C. (annealing).

Thereafter, through a single lithographic process, respective grooves 19' and 19" are etched in the layer of oxide 19. The first groove 19' extends up to the first layer of poly-silicon 7 and is, for example, outside of the dielectric region 8'. The second groove 19" extends in depth up to the second layer of doped poly-silicon 11, surrounding the first multi-layer structure 16 as shown in FIG. 8. Thereafter, the electrically conductive material like for example a metallization 20 is deposited. Then follows a conventional photolithographic process to define a photo-mask and an isotropic dry etching step to etch into the metallization 20 a first 20' and second 20" metallic region suitable for making contact, through the first groove 19', with the first electrically conductive layer 7 at the source well 7a and drain well 7b. In the metallization 20 a third metallic region 20''' is also etched that is suitable for making contact, through the second groove 19", with the second electrically conductive layer 11.

FIG. 8 illustrates the structure of the device obtained through the process described above.

Hereafter, the functions of the various layers introduced above will be specified more clearly. The substrate 1 is the support for the device 100, whereas the first layer of silicon dioxide 2 can preferably have characteristics such as to insulate the device itself from the substrate 1.

The layers 2 to 6 form a multi-layer lower mirror DM comprising a plurality of pairs of silicon dioxide-silicon nitride layers.

The layers 12, 13, 14, 15 and 19 form a multi-layer upper mirror UM comprising a plurality of pairs of silicon dioxide-silicon nitride layers. It should be observed that the two mirrors are dielectric mirrors.

The active layer 10, the first layer of P+ doped poly-silicon 7 and the second conductive layer of N+ doped poly-silicon 11 define an optical cavity of the device 100 apt for resonating at the emission wavelength $\lambda_0$.

The first and second electrically conductive layer layers 7, 11 form the respective lower and upper confinement layers of the laser cavity. The second electrically conductive layer 11 represents the gate of the FET structure that has formed (the source and drain wells of which are represented by the N+ doped wells 7a and 7b within the first electrically conductive layer 7). The active layer 10 represents the gate dielectric, as stated above. During operation the channel under the gate is opened, i.e. a current is created that flows from the source well 7a towards the drain well 7b. The hot electrons generated at the drain well following the creation of such a current are channeled towards the gate through the active layer 10; thanks to their high energy the electrons excite the nanocrystals by impact. The excitation is transferred by dipole moment from the nanocrystals to the erbium that radiatively recombines giving emission at the wavelength $\lambda_0$, in particular at the wavelength of 1540 nm. In general, the value of the wavelength $\lambda_0$ depends upon the emission wavelength relative to the optical medium represented by the active layer 10 that can also have emission in the visible light range in the case in which, for example, it is non-doped SRO or silicon oxide doped with Terbium. The voltage necessary to start the operation of the device is applied through the metallizations 20', 20" and 20'''.

It is important to observe that the dielectric region 8' increases the distance between the first 7 and the second 11 electrically conductive layers. On the other hand, in the first region 9, the first 7 and second 11 electrically conductive layers are separated just by the active layer 10 thus being closer together than occurs at the dielectric region 8'. The dielectric region 8' allows the current to be channeled towards the first region 9 favoring the emission that is amplified within the resonant cavity. The thickness of the active layer 10 must be chosen so as not to condition the optical mode of the cavity. The portion of the cavity corresponding to the first region 9 defines a main radiation generating zone, indicated in the figures with a dashed outline and a reference numeral 30.

The resonant cavity, therefore consisting of the first 7 and second 11 electrically conductive layers and the active layer 10, has particular optical characteristics such as to ensure the necessary destructive interference and thus the emission at $\lambda_0$.

In the proposed structure, advantageously, the first multi-layer structure 16 has a sufficient width suitable for ensuring that the main radiation zone 30 is completely included between the upper mirror UM and the lower mirror DM. The size of the cavity is $n\lambda/2$ (with n>1) so as to be able to use thicker layers of doped poly-silicon 7 and 11 that allow an improvement in the electrical operation of the device. Consequently, the active layer 10 will be thinner so that the aforementioned relationship is respected. The low thickness of the active layer 10 favors the lowering of the threshold voltages and improves the electrical operation of the device. Table 1 shows the reference thicknesses to be used to make the structure in the case in which the mirrors consist of alternate layers of silicon oxide and silicon nitride.

TABLE 1

Thicknesses Of The Layers (nm) According To $\lambda_0$ (nm)

| Layer | $\lambda_0 = 1540$ nm |
|---|---|
| Layers of silicon dioxide | 260 nm |
| Layers of silicon nitride | 190 nm |
| Layers of doped poly-silicon | 210 nm |
| Active layer in SRO | 50 nm |

The metallic regions 20' 20" and 20''' carry out the role of electrical contacts allowing the cavity to be supplied with a pumping electrical signal suitably generated to allow the creation of the current that flows from the source well 7a towards the drain well 7b. In particular, the first metallic region 20' makes contact with the first electrically conductive layer 7 at the source well 7a, the second metallic region 20" makes contact with the first electrically conductive layer 7 at the drain well 7b and the third metallic region 20''' makes contact with the second electrically conductive layer 11. The metallization 20''' preferably has an annular plan, whereas the metallizations 20' and 20" consist of two distinct portions of conductive material.

The pumping electrical signal is preferably a direct or alternate potential difference applied to the second electrically conductive layer 11 (gate) and to the doped source and drain wells 7a and 7b. Typical values of this potential difference are 5-6 V, depending upon the type of application of the type of device used and upon the type of active layer.

The RCLED device 100 thanks to the electrical pumping directly on the active layer 10 has high efficiency of emission. The presence of the resonant cavity allows optical radiation to be obtained at selected wavelength $\lambda_0$ and with high directionality.

The invention described above can also be implemented in the manufacture of a VCSEL device, which is a laser source. Such a VCSEL device can be structurally analogous to the one described above and shown in FIG. 8, apart for the fact that the active layer 10 is such as to foresee inversion of optical population following electrical pumping. In this case it is necessary for the number of pairs constituting the dielectric mirrors to be suitably researched so as to obtain an adequate quality factor.

Some examples of active layers that in the state of the art are thought to be suitable to create population inversions are SRO doped with erbium or else a MQW (Multi Quantum Well) structure comprising nanometric layers of silicon-silicon oxide.

An active layer including SRO doped with erbium is described in the article by M. E. Castagna et al. mentioned above.

With regard to the active layer 10 of SRO doped with erbium in such an article it has been demonstrated how it is possible to carry out electrical pumping of the erbium ions present in the SRO material, using such a layer as dielectric in the MOS (Metal Oxide Semiconductor) structure. However, the possibility of obtaining a population inversion has yet to be proven.

The device 100 in accordance with the invention (both of the RCLED type, and of the VCSEL type) is particularly suitable for application in optical interconnections, as a source of optical radiation to be launched, for example, in optical guides of the type in integrated technology and in fibre.

The device of the invention can also be used for the generation of electromagnetic radiation in the visible range; by using, for example, a layer of SRO or silicon oxide doped with terbium as active layer 10 emission is obtained at a wavelength equal to 540 nm.

Clearly, the principle of the invention remaining the same, the embodiments and the details of production can be widely varied with respect to what has been described and illustrated above purely as a non-limiting example, without for this reason departing from the scope of the invention as defined in the attached claims.

The invention claimed is:

1. A device having an FET structure for the emission of an optical radiation integrated on a substrate of a semiconductor material, the device comprising:
   a first mirror;
   a second mirror of a dielectric type;
   an active layer having a main zone between the first and second mirrors and configured to generate the optical radiation;
   a first electrically conductive layer comprising two doped regions defining a source well and a drain well of the device between which a current flows;
   a second electrically conductive layer defining a gate of the device; and
   a dielectric region between said first and second electrically conductive layers to space corresponding peripheral portions of said first and second electrically conductive layers so that the current is channeled in the main zone;
   said first and second electrically conductive layers and said active layer defining an optical cavity within the device, and wherein the device is laterally symmetric with reference to the optical cavity;
   the optical cavity having a thickness based upon $n(\lambda/2)$, wherein $n>1$ and $\lambda$ is a wavelength of the emission of optical radiation so that that optical cavity is configured to provide interference and the emission of radiation at $\lambda$.

2. The device according to claim 1, wherein the first and second electrically conductive layers are coupled, respectively, to the active layer in a first region to define the main zone.

3. The device according to claim 1, wherein the first mirror is formed on said substrate and comprises:
   at least a first layer of electrically insulating material placed in contact with said substrate; and
   at least a second layer of electrically insulating material placed in contact with said at least first layer of electrically insulating material.

4. The device according to claim 3, wherein said first and second electrically insulating layers included in the first mirror have a respective thickness and a refractive index so that the first mirror creates constructive interference for an emission wavelength of the device so as to reflect the optical radiation at the wavelength towards the active layer.

5. The device according to claim 1, wherein the second mirror is formed on said second electrically conductive layer and comprises:
   at least a third layer of electrically insulating material placed in contact with said second electrically conductive layer; and
   at least a fourth layer of electrically insulating material placed in contact with said at least third layer of electrically insulating material.

6. The device according to claim 5, wherein said at least third and fourth electrically insulating layers included in the second mirror have a respective thickness and a respective refractive index so that the second mirror creates constructive interference for an emission wavelength of the device so as to reflect the optical radiation at the wavelength towards the active layer.

7. The device according to claim 1, further comprising a metallization configured to supply the current channeled in the main zone.

8. The device according to claim 7, wherein the metallization comprises a first metallic region that contacts the first electrically conductive layer corresponding to the source well and a second metallic region that contacts the first electrically conductive layer corresponding to the drain well to supply a pumping electrical signal to supply the current.

9. The device according to claim 8, wherein the metallization comprises a third metallic region coupled to the second electrically conductive layer to supply the pumping electrical signal to supply the current.

10. The device according to claim 8, wherein the pumping electrical signal is a direct or alternate potential difference applied to the second electrically conductive layer and to the drain well and source well.

11. A method for manufacturing a device with an FET structure for the emission of optical radiation integrated in on a substrate of a semiconductor material, comprising:
    forming on the substrate a first mirror and a second mirror of a dielectric type;
    forming an active layer having a main zone between the first and second mirror and to generate the radiation;
    forming a first electrically conductive layer comprising two doped regions defining a source well and a drain well of the device between which a current flows;
    forming a second electrically conductive layer defining a gate of the device; and
    forming a dielectric region included between the first and second electrically conductive layers to space out corresponding peripheral portions of the first and second electrically conductive layers so that the current is channeled in the main zone;
    the first and second electrically conductive layers and the active layer being formed to define an optical cavity within the device, and wherein the device is laterally symmetric with reference to the optical cavity;
    the optical cavity having a thickness based upon $n(\lambda/2)$, wherein $n>1$ and $\lambda$ is a wavelength of the emission of optical radiation so that that optical cavity provides interference and the emission of radiation at $\lambda$.

12. The method according to claim 11, wherein the first and second electrically conductive layers are coupled, respectively, to the active layer in a first region to define the main zone.

13. The method according to claim 11, wherein the first mirror is formed on the substrate and comprises:
    at least a first layer of electrically insulating material placed in contact with the substrate; and
    at least a second layer of electrically insulating material placed in contact with the at least first layer of electrically insulating material.

14. The method according to claim 13, wherein the first and second electrically insulating layers included in the first mirror have a respective thickness and a refractive index so that the first mirror creates constructive interference for an emission wavelength of the device so as to reflect the optical radiation at the wavelength towards the active layer.

15. The method according to claim 11, wherein the second mirror is formed on the second electrically conductive layer and comprises:

at least a third layer of electrically insulating material placed in contact with said second electrically conductive layer; and at least a fourth layer of electrically insulating material placed in contact with the at least third layer of electrically insulating material.

16. The method according to claim 15, wherein the at least third and fourth electrically insulating layers included in the second mirror have a respective thickness and a respective refractive index so that the second mirror creates constructive interference for an emission wavelength of the device so as to reflect the optical radiation at the wavelength towards the active layer.

17. The method according to claim 11, further comprising creating a metallization to supply the current channeled in the main zone.

18. The method according to claim 17, wherein the metallization comprises a first metallic region that contacts the first electrically conductive layer corresponding to the source well and a second metallic region that contacts the first electrically conductive layer corresponding to the drain well to supply a pumping electrical signal to supply the current.

19. The method according to claim 18, wherein the metallization comprises a third metallic region coupled to the second electrically conductive layer to supply the pumping electrical signal to supply the current.

20. The method according to claim 18, further comprising furnishing the pumping electrical signal to the second electrically conductive layer and to the drain well and source well as a direct or alternate potential difference.

* * * * *